(12) United States Patent
Bergsma

(10) Patent No.: US 7,259,550 B2
(45) Date of Patent: Aug. 21, 2007

(54) DEVICE FOR CALIBRATION OF MAGNETIC SENSORS IN THREE DIMENSIONS

(75) Inventor: Felix Bergsma, Peron (FR)

(73) Assignee: European Organisation for Nuclear Research - CERN, Geneva (CH)

( * ) Notice: Subject to any disclaimer, the term of this patent is extended or adjusted under 35 U.S.C. 154(b) by 225 days.

(21) Appl. No.: 10/519,975

(22) PCT Filed: Jul. 1, 2002

(86) PCT No.: PCT/EP02/07226

§ 371 (c)(1), (2), (4) Date: Jul. 11, 2005

(87) PCT Pub. No.: WO2004/003585

PCT Pub. Date: Jan. 8, 2004

(65) Prior Publication Data

US 2006/0164073 A1 Jul. 27, 2006

(51) Int. Cl.
*G01R 35/00* (2006.01)

(52) U.S. Cl. .................................. 324/202

(58) Field of Classification Search ............... 324/202, 324/207.2, 235, 251, 260–262, 529; 73/1.41
See application file for complete search history.

(56) References Cited

U.S. PATENT DOCUMENTS

| 4,109,199 A | * | 8/1978 | Ball et al. ............ 324/202 |
| 4,338,810 A | | 7/1982 | Gollomp |
| 4,514,687 A | * | 4/1985 | Van Husen .............. 324/537 |
| 4,622,644 A | | 11/1986 | Hansen |
| 4,767,988 A | | 8/1988 | Wilson |
| 4,771,237 A | * | 9/1988 | Daley .................... 324/202 |
| 5,668,470 A | * | 9/1997 | Shelor ................... 324/202 |
| 5,694,037 A | * | 12/1997 | Palstra et al. ............ 324/202 |
| 5,990,679 A | | 11/1999 | Frommer |
| 6,127,821 A | * | 10/2000 | Ramsden et al. ......... 324/202 |
| 6,278,271 B1 | | 8/2001 | Schott |

FOREIGN PATENT DOCUMENTS

EP 0756179 A2 1/1997

* cited by examiner

*Primary Examiner*—Edward Lefkowitz
*Assistant Examiner*—Kenneth J Whittington
(74) *Attorney, Agent, or Firm*—Christensen O'Connor Johnson Kindness PLLC

(57) ABSTRACT

A magnetic calibration device comprises a mount supporting a magnetic sensor card being detachably attached and comprising at least one magnetic sensor to be calibrated and connected to a first analog electronic circuit with a current source and a first analog to digital converter. A coil card is further detachably attached and comprises three coils arranged substantially orthogonal to each other and connected to a second analog electronic circuit with a second analog to digital converter. A connection such as a cable or a wireless link provides a supply voltage to the first and second analog electronic circuits, respectively, and guides digital signals from the first and second analog to digital converters, respectively, to at least one processing unit. A magnet generates a substantially homogeneous and constant calibration magnetic field, and a rotator rotates said cards in said calibration magnetic field around two substantially orthogonal axes.

25 Claims, 4 Drawing Sheets

DEVICE FOR CALIBRATION OF MAGNETIC SENSORS IN THREE DIMENSIONS

The present invention refers to a magnetic calibration device, in particular for calibrating Hall sensors in three dimensions.

It is common to use Hall sensors to determine the strength of a magnetic field present in medical, physical or technical setups or systems. For example, EP 0 947 846 A2 discloses a three dimensional (3D) magnetic field sensor for measuring the three components of a magnetic field comprising a Hall sensor and an electronic circuit The Hall sensor comprises an active area of a first conductivity type in connection with voltage and current contacts. Four voltage contacts are present which are, in turn, connected to input terminals of the electronic circuit. By means of summation and subtraction, respectively, of selected electrical potentials of the voltage contacts, the electronic circuit derives three signals which are proportional to the three components of the magnetic field. Additionally, the magnetic field sensor has the advantage that it measures all three components of the magnetic field at a common volume or point due to the fact that the common active area has a size of typically only 100 µm*100 µm up to 300 µm*300 µm. However, since the Hall sensor exhibits a high cross sensitivity between the components of the magnetic field there is a need of a reliable, precise calibration, especially in case one is interested in a high resolution even in high magnetic fields.

A conventional two axes calibration device with a rotator would require high precision position or angle encoders to achieve high resolution. Besides their inexpedient sizes encoders of that kind are very expensive. Moreover the rotator of the calibration device must be designed to have a play less than $10^{-4}$ rad resulting in a cost increasing production.

It is therefore the object of the present invention to provide a magnetic calibration device overcoming the drawbacks of the prior art. In particular, it is the object of the present invention to provide a simple calibration device for calibrating a magnetic field sensor, which is capable of calibrating a magnetic filed sensor with a high precision, i.e. a high resolution. It is another object of the present invention to provide a calibration device which measures all three components of a magnetic field independent of its orientation relative to the magnetic field.

This object is achieved by a magnetic calibration device comprising a mounting means designed to support at least one magnetic sensor card being detachably attached and comprising at least one magnetic sensor, in particular in form of a Hall sensor, to be calibrated and connected to a first analog electronic circuit with at least one current source as well as at least one first analog to digital converter and at least one coil card being detachably attached and comprising three coils arranged substantially orthogonal to each other and connected to a second analog electronic circuit with at least one second analog to digital converter; at least one connection means, in particular in form of a cable or a wireless link, for applying at least one supply voltage $V_S$ to the first and second analog electronic circuits, respectively, and for guiding digital signals from the first and second analog to digital converter, respectively, to at least one processing unit; a magnet for generating a substantially homogeneous and constant calibration magnetic field; and a rotator for rotating said cards in said calibration magnetic field around two substantially orthogonal axes.

In one embodiment of the invention the rotator comprises two conical gears, such as tooth gears or roll gears, two substantially concentrically arranged shafts and at least one driving unit for the shafts, in particular in form of a stepper engine controller connected to two engines and/or connected to the shafts via worm wheels.

It is preferred that the at least one driving unit is arranged outside the calibration magnetic field.

According to the invention the speed and direction of rotation of the two shafts can be controlled by the at least one driving unit to cover the full ranged of polar and azimuthal angles of the unit sphere by a continuous movement, preferably including a time reversed rotation for compensating induction effects in the at least one magnetic sensor.

In addition, in one embodiment of the invention the magnetic calibration device is at least partly formed by vibration damping and non-conducting material, preferably at least one of the shafts comprises heavy, non-conducting material and/or is arranged in slide bearings.

With the invention it is proposed that the amount of turns of the inner shaft differs from the amount of turns of the outer shaft by one turn within one calibration cycle, the cable being preferably turned only once within one calibration cycle.

It is preferred that the at least one processing unit is arranged outside the calibration magnetic field and stationary.

In yet another aspect of the invention several magnetic sensor cards and/or at least one magnetic sensor card and the coil card are stackable next to each other, preferably closely spaced apart.

In one embodiment at least one dowel pin, screw, plug, clamp and/or clip to precisely and reproducibly position at least one magnetic sensor card and/or coil card is provided.

According to the invention the space occupied by the three coils on the coil card can amount up to around $10 \times 10 \times 10$ mm³ for magnetic fields in the range of about 0.1 to 2.0 Tesla.

In still another embodiment of the invention the coils are wound from 20 µm wire into the form of cylinders with a diameter and height each of up to around 5 mm, for magnetic fields in the range of about 0.1 to 2.0 Tesla and/or are each surrounded by a grounded electrostatic shield.

In another aspect of the invention one magnetic sensor card carries one 3-dimensional or one 2-dimensional and one 1-dimensional or three 1-dimensional Hall sensor(s).

It is proposed with the invention that the first analog electronic circuit comprises at least one low pass filter, multiplexer and/or delta-sigma modulator.

It is also proposed with the invention that the second analog electronic circuit comprises at least one low pass filter, multiplexer and/or delta-sigma modulator It is preferred that the first and/or second electronic circuit, in particular the at least one low pass filter, is arranged in the region of the center of rotation of the cards.

A further embodiment is characterized by the process unit comprising means for integrating the digital coil signals to obtain the components of the calibration magnetic field in angular coordinates relative to the coils; means for decomposing the digital magnetic sensor output voltages into spherical harmonics on the basis of the obtained angular coordinates; and means for storing the obtained coefficients of the spherical harmonics as a function of the calibration magnetic field to obtain a calibration table.

Optionally in one embodiment of the invention there is at least one magnetometer, in particular at least one NMR magnetometer and/or fixed Hall sensor, arranged within the calibration magnetic field and connected to the processing unit to provide the absolute value of the calibration magnetic field to the processing unit.

The processing unit preferably comprises means for performing a transformation of the obtained angular coordinates for aligning the reference frame with the symmetry axes of the at least one magnetic sensor.

In addition, one embodiment of the invention is characterized by at least one temperature sensing element, comprised by a thermistor or the Hall sensor and connected to the processing unit in order to supply the temperature within the calibration magnetic field, in particular of the Hall sensor, to the processing unit.

With the invention it is preferred that the processing unit comprises means for obtaining the temperature of the Hall sensor by decomposing the Hall input voltages depending on the magnitude and direction of the calibration magnetic field and the temperature into spherical harmonics on the basis of the decomposition of the Hall output voltages.

In still another embodiment of the invention a thermal insulating box housing the mounting means with the magnetic sensor and coil cards is provided, said thermal insulating box preferably connected to a control circuit for controlling the temperature within the box, measured in particular by the temperature sensing element.

In one ether aspect of the invention the control circuit, preferably comprised by the processing unit, comprises a Peltier element for cooling and/or heating, at least one ventilator, preferably driven by an engine outside the calibration magnetic field, and a controller.

With the invention it is also proposed that the current source of the Hall sensor is either a constant current source or a precise voltage source with an internal resistance substantially equal to the input resistance of the Hall sensor.

Optionally in one embodiment of the invention at least two magnetic sensor cards are supported by tie mounting means, one card carrying at least one calibrated Hall sensor and each remaining card carrying at least one Hall sensor to be calibrated by comparison with the at least one calibrated Hall sensor.

Finally in one embodiment of the invention the processing unit is comprised by a microprocessor and/or personal computer.

Accordingly, with the invention a magnetic calibration device is provided, which rotates continuously around two orthogonal axes three substantially orthogonal coils and for example one 3-dimensional Hall sensor to be calibrated in a constant homogeneous magnetic field. The full range of polar and azimuthal angles is covered by a respective rotation. The parts of the device to be rotated are made compact to fit in between pole pieces of a special magnet. The magnetic field has to be constant and homogeneous at least across the space covered by the coils and the Hall sensors during rotation. Such a magnetic field can be found in a special magnet with optimized coil and pole dimensions or at the center of a large magnet. The larger the homogeneous region of the magnet, the more Hall sensors can be calibrated at the same time.

The Hall sensors to be calibrated are precision fit on the magnetic calibration device of the invention by means of dowel pins, screws or clamps. The orientation of the coils and the Hall sensors is derivable from the integrated coil voltages.

With the device of the invention a calibration of Hall sensors against at least one of the calibrated Hall sensors is possible, minimizing the calibration time.

A special rotator is used in the magnetic calibration device of the invention for a smooth rotation, necessary to avoid orientation errors. Every abrupt movement of a rotator would give rise to a peak in the coil voltages and an increased error in the integration thereof necessary to obtain the components of the calibration magnetic field. The rotator is driven by two concentric axes, the outer one drives a flange which carries a mounting means for coil cards and Hall sensor cards. The mounting means is driven via two conical tooth gears by both concentric axes. The conical tooth gears can be replaced by conical roll gears without teeth. The movement becomes in this case smoother, but because of slip the positioning is less precise. By choosing the proper speed and direction of rotation of the axes the full range of polar and azimuthal angles is covered by a continuous movement. The speed is limited by the vibration level. The inner axes should make one turn more or one turn less than the number of turns of the outer axes to end at the same position as started from. This means that even after a calibration of many turns of the axes cables make only one effective turn. Making a calibration with time reversed rotation can determine the effect of induction in the Hall circuit.

Heavy, non-conducting material is used to reduce vibrations and to avoid Eddy currents. Mechanical damping is achieved by using silicon grease in slide bearings of the shafts and gears.

The mounting means is fixed by two centering screws with hand grip to the flange on the outer axis. This makes it easy to remove the mounting means from the rest of the device to change the Hall sensor cards to be calibrated outside the magnet.

The magnetic calibration device of the invention is contained in a thermal insulation box, the temperature of which is regulated by a Peltier element and controller. The controller comprises a thermistor which is placed close to the rotating mounting means. The external part of the Peltier element is ventilated by a fan outside the magnetic field. Inside the insulation box a ventilator stirs the air in order to get uniform temperature. The ventilators are driven by engines outside the magnetic field.

The electronics of a magnetic calibration device of the invention comprises for each coil a low-pass filter and an analog to digital converter, for example a delta sigma modulator. The output voltages of the Hall sensor to be calibrated are also converted into digital signals by a delta sigma modulator. The pass band of the low-pass filters and sample rates of the delta sigma modulators are optimized to reduce electronic and mechanical noise of the system, in particular to give acceptable integration errors. All field sensitive components on the coil cards and Hall sensor cards are arranged as close as possible to the rotation center of said cards. All leads are kept short and with small loop surface against parasitic induction.

The analog to digital converters need a voltage reference. Since it is difficult to design a voltage reference which is completely field in-sensitive, it is not placed on the rotating platform but stationary and as close as possible to the analog to digital converter, connected by a tight twisted pair cable kept in a flexible cable guide. This flexible cable guide contains also twisted pair leads of supply voltages and digital signals of the analog to digital converters. The digital lines of the coil cards and Hall sensor cards can be shared. The supply voltage leads can be replaced by a system of collectors, and the digital lines can be replaced by wireless links. In this case a flexible cable can be omitted and vibrations are further reduced.

The coils are formed as cylinders with typical diameters and heights of 5 mm, filled with windings of wire with small possible diameters (0.02 mm) for magnetic fields of around 0.1 to 2.0 Tesla They are surrounded by grounded electrostatic shields.

The stability of the magnetic field is monitored by a fixed NMR-magnetometer as close as possible to the magnet center and by several fixed Hall sensors.

The Hall sensor card is supplied with a small Hall current, so it will dissipate little heat and follow ambient temperature. No thermostat for the Hall sensor is needed, whereas a temperature sensor close to it makes it possible to calibrate at fixed temperatures. Alternatively, the temperature of the Hall sensor is determined by measuring its input voltage as a function of both the magnetic field and temperature.

As a current source for the Hall sensor a precise voltage source with an internal resistance substantially equal to the input resistance of the Hall sensor can be used. In this case the heat produced in the Hall sensor would change considerably less due to internal resistance changes of the Hall sensor as a function of magnetic field, resulting in a more stable temperature. With a more stable temperature an extra thermistor is not needed, in particular when processing the Hall output and input voltages to obtain information on the magnetic field and temperature values.

No absolute reference voltage for the whole sensor analog digital converter is used, as the analog digital converter reference voltage and the Hall current are made linearly dependent from the supply voltage. Therefore, small changes in the supply voltages do not influence the sensitivity of the Hall sensor. A circuit to control the analog to digital converter sensitivity is foreseen.

A three dimensional Hall sensor can be build from three one dimensional sensors, one two dimensional sensor plus one dimensional sensor or one three dimensional sensor.

The different coil cards and Hall sensor cards are addressable via a serial data line, many serial data lines being put on same bus.

An algorithm is used by the magnetic calibration device of the invention which is based on a decomposition of Hall voltages as a function of azimuthal and polar angles into spherical harmonics. Due to the orthogonality of the spherical harmonics this decomposition is unique. After the decomposition a transformation is made to align the reference frame of the spherical harmonics with the symmetry axes of the Hall sensors which makes it easy to compare different Hall sensors. The maximum order of spherical harmonics one can extract is about equal to the number of turns of the main axes of the rotator.

By interpolation in a table of coefficients of spherical harmonics measured at different values of magnetic field and temperature it is possible to reconstruct the components of a magnetic field with high precision from three measured Hall voltages and the temperature. Also the input Hall voltage can be decomposed as a function of magnetic field and temperature in order to reconstruct the magnetic field and the temperature, omitting a separate temperature sensor. The advantage of a one chip 3-dimensional Hall sensor in this case is that there is only one Hall input voltage.

The invention, together with further objects and advantages, may be best understood, by example, with reference to the following description of one embodiment taken together with the accompanying schematic drawings, in which FIG. 1 is a cross sectional view of a magnetic calibration device according to the invention;

Figure 1:
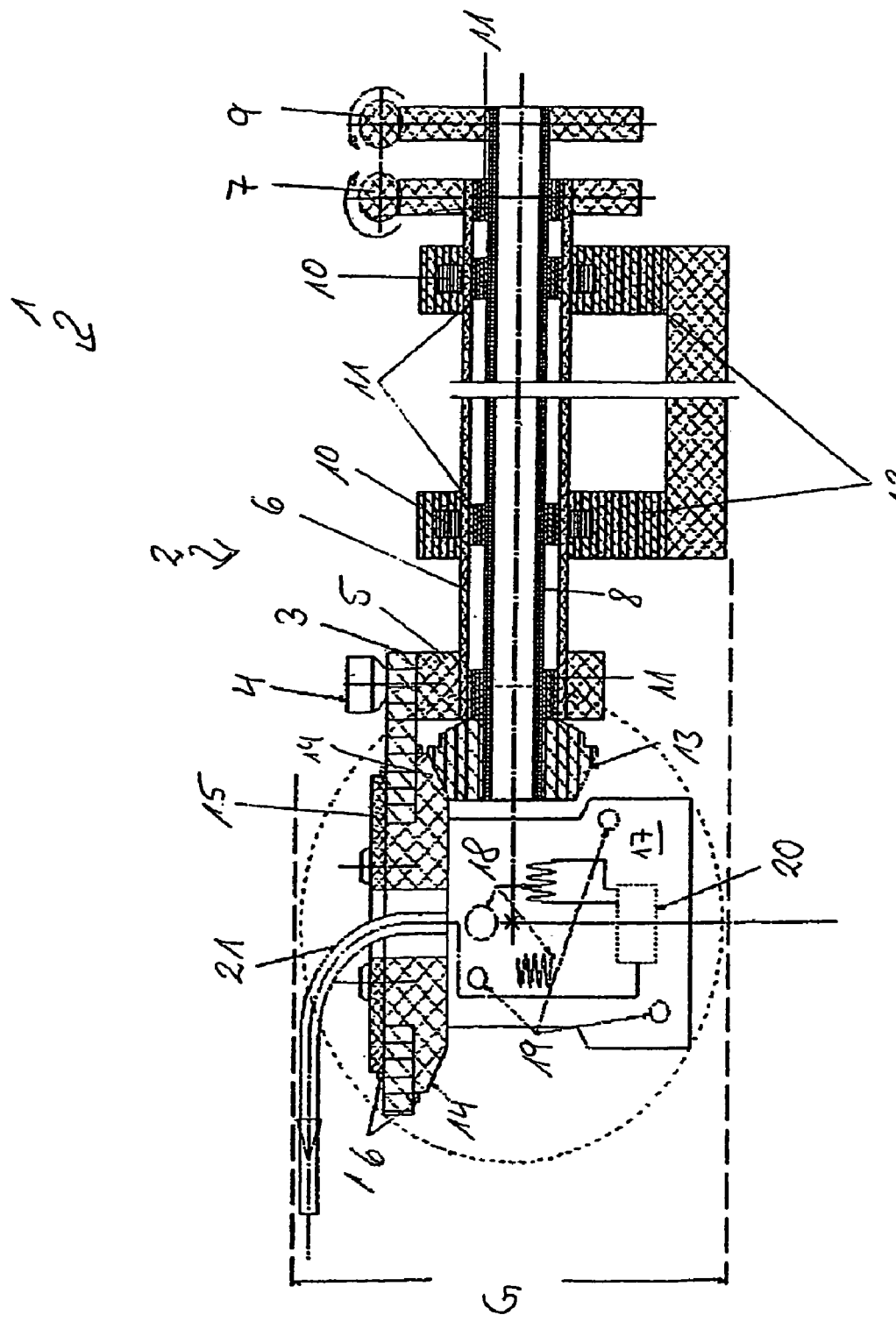
Figure 2:
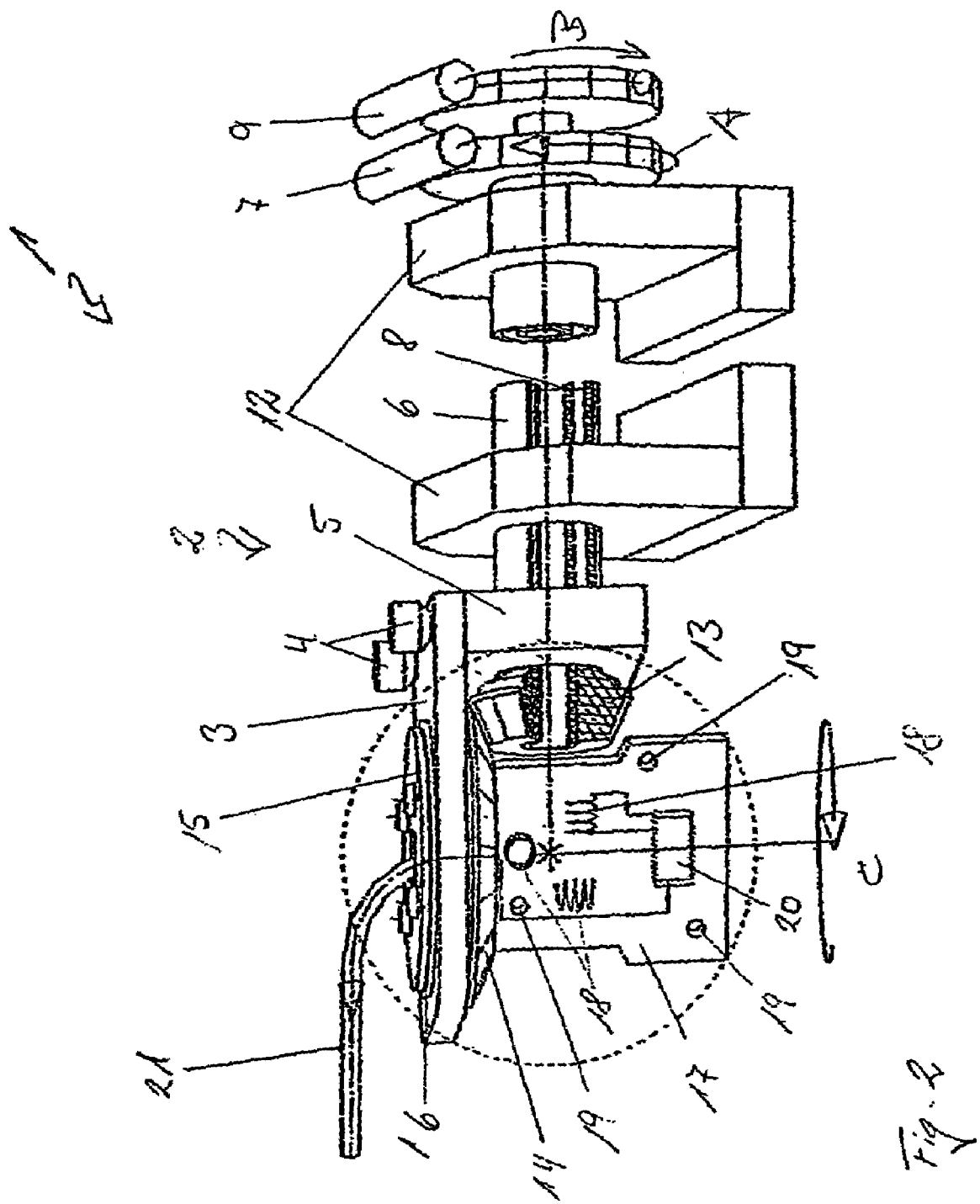
FIG. 2 is a perspective side view of the magnetic calibration device of FIG. 1.

In FIG. 1 and FIG. 2 a magnetic calibration device 1 of the invention is illustrated comprising a rotator 2 composed of a support plate 3 which is fixed via mounting screws 4 on a flange 5. This flange 5 is secured on an outer shaft 6 which is driven by a first worm wheel 7. An inner shaft 8 lying concentrically within the outer shaft 6 is driven by a second worm wheel 9. The second and first worm wheels 7, 9 are in turn driven by two engines (not shown). The whole shaft assembly is supported by slide bearings 10 and 11 supporting the outer shaft 6 and inner shaft 8, respectively. The slide bearings 11 for the outer shaft 6 are encapsulated in two holders 12.

At the support plate 3 facing end of the inner shaft 8 a first conical gear 13 is arranged which meshes with a second conical gear 14 perpendicular to gear 13. The second conical gear 14 is secured to rotate in the support plate 3 with a mounting plate 15 screwed to it. For damping mechanical vibrations the second conical gear 14 as well as the slide bearings 10, 11 are provided with silicon grease. In order to prevent any leakage of grease, the second conical gear 14 and the mounting plate 15 are sealed with O-rings 16 against to the support plate 3. The conical gears 13, 14 can either be conical tooth gears or conical roll gears which do not have any teeth. The main difference is that the conical roll gear will provide a somewhat smoother movement of the rotator whereas the positioning is less precise because of slip. On the second conical gear 14 a coil card 17 is mounted, said coil card 17 carrying substantially all, in particular analog, electronics including three orthogonal coils 18. Three holes 19 are distributed over the coil card 17 to receive screws or dowel pins (not shown) for supporting or rather precision positioning the card as shown in FIG. 1 or 2. One or more Hall sensor cards are mounted in the same way. The coil card 17 is rotatable together with the Hall sensor card(s) around two orthogonal axes via the concentric shaft assembly 6 to 9 and the conical gears 13, 14 in order to cover the full range of polar and azimuthal angles as shown in the FIGS. 4 to 6.

Figure 3:
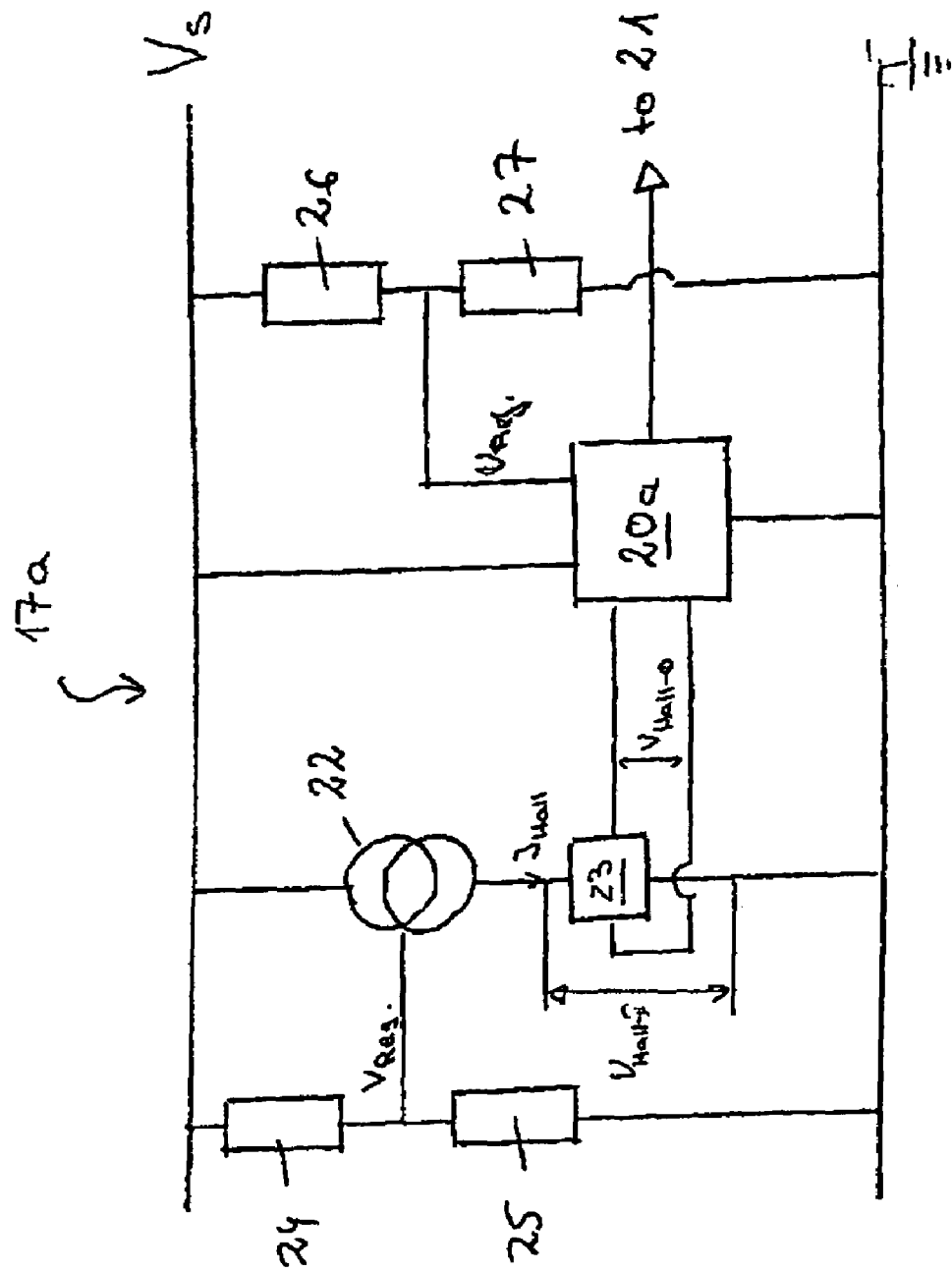
FIG. 3 is a block diagram of the electronic circuit on a Hall sensor card used in the magnetic calibration device of FIGS. 1 and 2.

A Hall sensor card 17a as shown in FIG. 3 comprises an electronic circuit to which a supply voltage $V_S$ is applied. By the help of voltage deviders in form of resistors 24 to 27 a reference voltage $V_{Ref}$ for the analog to digital converter 20a and a regulation voltage $V_{Reg}$ of a current source 22 for a Hall sensor 23 is obtained. This ensures that the reference voltage $V_{Ref}$ and the Hall current $I_{Hall}$ are both made linearly dependent from the supply voltage $V_S$. Therefore small changes in the supply voltages VS do not influence the sensitivity of the Hall sensor 23. The Hall sensor 23 is connected to the low pass filter and analog to digital converter 20a.

The whole calibration device 1 is manufactured out of heavy non-conducting material(s) to reduce or inhibit both vibrations and eddy currents during movement For example, the shaft assembly 6 to 9 is made out of bakelite and the conical gears 13, 14 are made out of an acetalhomopolymer named delrin. Suitable are other phenolic resins or polyacetals or synthetics in general too which have the above mentioned desired characteristic features.

Figure 4:
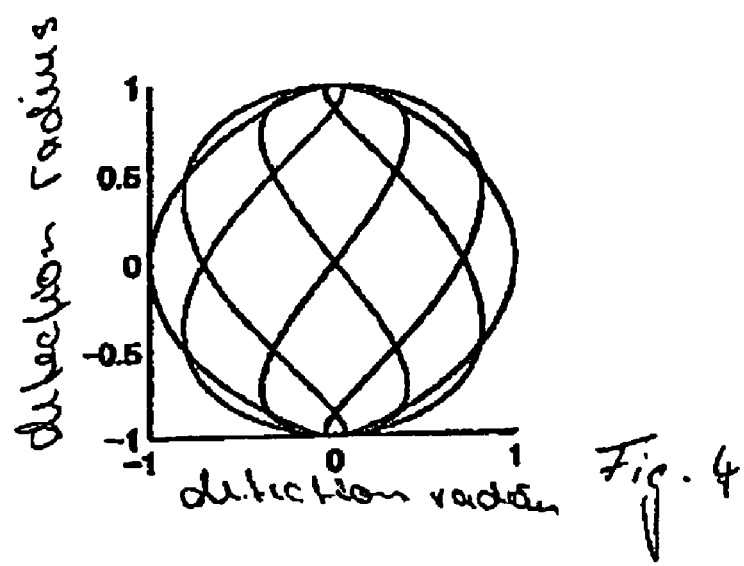
FIG. 4 is a side view of an exemplary coverage of the unit sphere during calibration for 4 turns of the outer axis.
Figure 5:
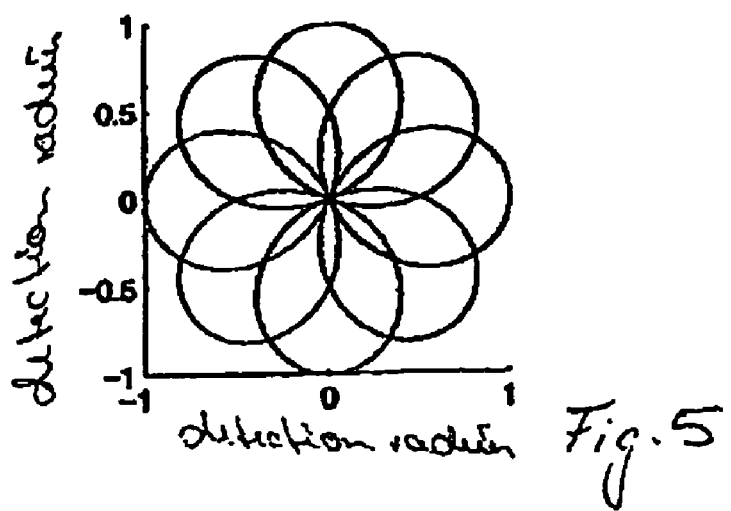
FIG. 5 is a top view of the coverage of FIG. 4.
Figure 6:
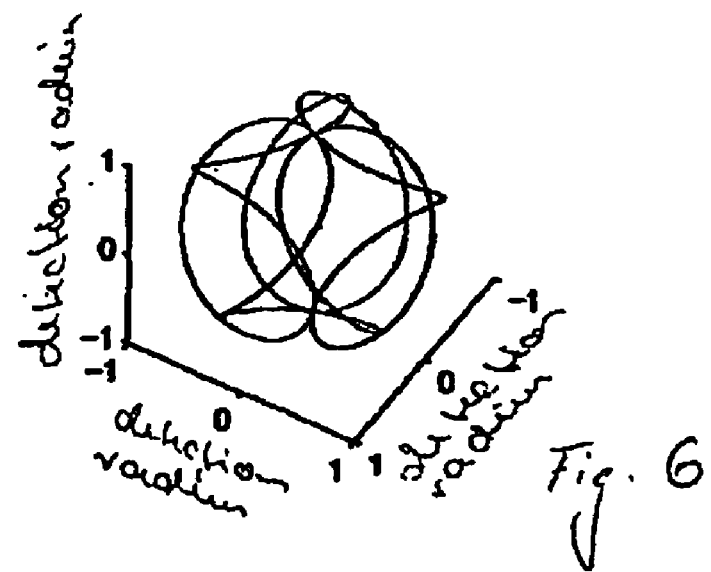
FIG. 6 is a perspective view of the coverage of FIG. 4.

For calibration purposes the device 1 is arranged in a constant and homogeneous field between the poles of a magnet (not shown). The two engines driving the worm wheels 7, 9 are placed in a remote location outside any magnetic field of relevant strength. Driving the outer shaft 6 in a certain direction by means of one particular engine, indicated for example in FIG. 2 by the arrow A, the flange 5 and, thus, the coil card 17 and Hall sensor card 17a are rotating in the same manner. A rotation of the inner shaft 8 via the second engine, indicated in FIG. 2 by the arrow B, sets the coil card 17 and Hall sensor card 17a rotating in a direction shown by the arrow C in FIG. 2. In particular, the coverage of a unit sphere is shown in the FIGS. 3 to 5 for the calibration device 1, i.e. for the coils 18 on the coil card 17, with four turns of the outer axes and three turns of the inner axes. The radii in the FIGS. 4 to 6 are normalized to the value of 1.

Furthermore, as the calibration device 1 is very sensitive to a change in temperature, the rotator 2 is placed inside a thermal insulation box (not shown) within which the temperature is controlled by a thermistor, a Peltier element and a controller (not shown) to diminish temperature gradients. The thermistor is placed close to the rotating coil card 17. The external part of the Peltier element is ventilated by a fan outside the field of the magnet via a hose (not shown). Additionally, to establish a uniform temperature field in the insulation box a ventilator is built in which stirs the enclosed air, such that a temperature stability of around +/−0.02K is achieved.

In the illustrated embodiment the three cylindrical coils 18 are situated on the rotating coil card 17 with an orientation substantially orthogonal to each other. Each coil 18 has a height of around 5 mm and a diameter of 5 mm and is wound of wire having a thickness of around 0.02 mm. The small size of the coils 18 allows the operation in a magnetic field which has to be constant and homogeneous in a finite volume of minimally $10 \times 10 \times 10$ mm$^3$ in size.

Each voltage induced in the coils 18 during rotation in a magnetic field is fed to a separate low pass filter and analog to digital converter 20, said analog to digital converter 20 being in form of a 24 bit $4^{th}$ order $\Delta$-$\Sigma$-modulator (delta sigma modulator). The $\Delta$-$\Sigma$-modulator converts its input signal into a stream of bits with a high clock rate or rather output word rate whereas the low pass filter cuts off frequencies higher then ½ of the output word rate.

Special attention has been paid to the electronics. When positioning the field sensitive components, such as the coils, the Hall sensors to be calibrated and their current circuits, they are arranged as close as possible to the rotation center of the cards 17, 17a. Leads are kept short, twisted and with small loop surface against parasitic induction. A flexible cable guide 21 contains all the twisted pair leads of the supply voltages and the digital signals from the analog to digital converters. The digital lines can be shared by the Hall sensor card 17a and coil card 17. Further, the supply voltage leads can be replaced by a system of collectors, the digital lines can be replaced by a wireless link, e.g. infra-red. In that case the flexible cable can be omitted, which reduces vibration.

The effect of induction in the Hall circuit can be determined by making a calibration with reversed rotation as for example in comparison to the rotation shown in the FIGS. 3 to 5.

The stability of the magnetic field during calibration can be monitored for example by a fixed NMR-magnetometer (not shown) as close as possible to the magnet center and by several fixed Hall sensors (not shown).

In the following the calibration of a three dimensional Hall sensor within a calibration magnetic field will be described:

During calibration the cards 17, 17a rotate continuously to minimize integration errors around the two orthogonal axes driven by the shafts 6, 8 such that the full range of the polar and azimuthal angles is covered.

On the coil card 17 the coil voltages are filtered and the analog filtered signals are converted into digital signals. The sampled digital signals are directed from the coil card 17 to a remote processing unit (not shown), in particular comprised by a microprocessor.

Within the microprocessor, in particular off-line, the filtered coil signals are reconstructed and integrated to obtain the components of the calibration magnetic field in angular coordinates relative to the coils, whereas the absolute value of the calibration magnetic field comes from, for example, a NMR magnetometer.

On the Hall sensor card the Hall input voltages as well as Hall output voltages are filtered and converted into digital signals. The digital signals are forwarded from the Hall sensor card to the remote processing unit or rather micro processor.

Within the microprocessor the digital Hall voltage signals are decomposed into spherical harmonics on the basis of the angular coordinates obtained from the coil voltages.

With calibrations done at different absolute values of the magnetic calibration field and temperature, tables of the coefficients of spherical harmonics for each Hall sensor can be stored for each field value and temperature value to obtain a calibration table.

Such a calibration table can be used later on to obtain the components of a magnetic field with the calibrated Hall sensor on the basis of measured Hall voltages.

The magnetic calibration device of the invention in combination with a mathematical algorithm to implement the above described steps allows a calibration of one or more dimensional Hall probes with high precision. The present invention permits the calibration of a 3D Hall sensor which can also be built up from three 1D Hall sensors or one 2D plus one 1D Hall sensor. In addition, the calibration device of the invention can be used also to calibrate magnetic sensors against an already calibrated 3D Hall sensor, with the requirement for a continuous movement being inapplicable and a shorter calibration time resulting due to the fact that fast movement, i.e. rotation, from one point to another is possible.

By way of example it is to be mentioned that the present invention can be used to determine magnetic field strength in synchrotron light sources or RF power supplies, like beam magnets or wigglers or in the field of medical physics, like NMR systems or irradiation facilities.

Although modifications and changes maybe suggested by those skilled in the art, it is the intention of the applicant to embody within the patent warranted hereon all changes and modifications as reasonably and probably come within the scope of this contribution to the art. The features of the present invention which are believed to be novel are set forth in detail in the appended claims. The features disclosed in the description, the figures as well as the claims could be essential alone or in every combination for the realization of the invention in its different embodiments.

REFERENCE SIGN LIST 1 calibration device
2 rotator
3 support plate
4 mounting screw
5 flange
6 outer shaft
7 first worm wheel
8 inner shaft
9 second worm wheel
10 slide bearing for the outer shaft
11 slide bearing for the inner shaft
12 slide bearing holder
13 first conical gear
14 second conical gear
15 mounting plate
16 O-ring
17 coil card
17a Hall sensor card
18 coil
19 dowel pin hole
20 low pass filter and analog to digital converter
20a low pass filter and analog to digital converter
21 cable guide
22 current source
23 Hall sensor
24-27 resistor
A rotation direction
B rotation direction
C rotation direction
G pole gap
$J_{Hall}$ Hall input current
$V_{Hall-i}$ Hall input voltage
$V_{Hall-o}$ Hall output voltage
$V_{Ref.}$ reference voltage
$V_{Reg.}$ regulation voltage
$V_S$ supply voltage

The invention claimed is:

1. A magnetic calibration device comprising:
a mount designed to support at least one magnetic sensor card being detachably attached and comprising at least one magnetic sensor, in particular in form of a Hall sensor, to be calibrated and connected to a first analog electronic circuit with at least one current source as well as at least one first analog to digital converter and at least one coil card being detachably attached and comprising three coils arranged substantially orthogonal to each other and connected to a second analog electronic circuit with at least one second analog to digital converter;
at least one connection in form of a cable or a wireless link for applying at least one supply voltage $V_S$ to the first and second analog electronic circuits, respectively, and for guiding digital signals from the first and second analog to digital converters respectively, to at least one processing unit;
a magnet for generating a substantially homogeneous and constant calibration magnetic field; and
a rotator for rotating said cards in said calibration magnetic field around two substantially orthogonal axes.

2. The magnetic calibration device according to claim 1, wherein the rotator comprises two conical gears, such as tooth gears or roll gears, two substantially concentrically arranged shafts and at least one driving unit for the shafts, in particular in form of a stepper engine controller connected to two engines and/or connected to the shafts via worm wheels.

3. The magnetic calibration device according to claim 2, wherein the at least one driving unit is arranged outside the calibration magnetic field.

4. The magnetic calibration device according to claim 2, wherein the speed and direction of rotation of the two shafts is controlled by the at least one driving unit to cover the full range of polar and azimuthal angles of the unit sphere by a continuous movement.

5. The magnetic calibration device according to claim 4, further including a time reversed rotation for compensating induction effects in the at least one magnetic sensor.

6. The magnetic calibration device according to claim 2, wherein the amount of turns of the inner shaft differs from the amount of turns of the outer shaft by one turn within one calibration cycle, the cable being turned only once within one calibration cycle.

7. The magnetic calibration device according to claim 2, wherein the magnetic calibration device is at least partly formed by vibration damping and nonconducting material, and wherein at least one of the shafts comprises heavy, nonconducting material and/or is arranged in slide bearings.

8. The magnetic calibration device according to claim 1, wherein several magnetic sensor cards and/or at least one magnetic sensor card and the coil card are stackable next to each other closely spaced apart.

9. The magnetic calibration device according to claim 1, further comprising at least one dowel pin, screw, plug, clamp and/or clip to precisely and reproducibly position at least one magnetic sensor card and/or coil card.

10. The magnetic calibration device according to claim 1, wherein one magnetic sensor card carries one 3-dimensional or one 2-dimensional and one 1-dimensional or three 1-dimensional Hall sensor(s).

11. The magnetic calibration device according to claim 1, wherein the first analog electronic circuit comprises at least one low pass filter, multiplexer and/or delta-sigma modulator.

12. The magnetic calibration device according to claim 1, wherein the second analog electronic circuit comprises at least one low pass filter, multiplexer and/or delta-sigma modulator.

13. The magnetic calibration device according to claim 12, wherein the second electronic circuit, in particular the at least one low pass filter, is arranged in the region of the center of rotation of the cards.

14. The magnetic calibration device according to claim 1, wherein the processing unit comprises:
means for integrating the digital coil signals to obtain the components of the calibration magnetic field in angular coordinates relative to the coils;
means for decomposing the digital magnetic sensor output voltages into spherical harmonics on the basis of the obtained angular coordinates; and
means for storing the obtained coefficients of the spherical harmonics as a function of the calibration magnetic field to obtain a calibration table.

15. The magnetic calibration device according to claim 1, further comprising at least one magnetometer, in particular at least one NMR magnetometer and/or fixed Hall sensor, arranged within the calibration magnetic field and connected to the processing unit to provide the absolute value of the calibration magnetic field to the processing unit.

16. The magnetic calibration device according to claim 1, wherein the processing unit comprises:

means for performing a transformation of the obtained angular coordinates for aligning the reference frame with the symmetry axes of the at least one magnetic sensor.

17. The magnetic calibration device according to claim 1, further comprising at least one temperature sensing element, comprised by a thermistor or the Hall sensor and connected to the processing unit in order to supply the temperature within the calibration magnetic field, in particular of the Hall sensor, to the processing unit.

18. The magnetic calibration device according to claim 17, wherein the processing unit comprises:
   means for obtaining the temperature of the Hall sensor by decomposing the Hall input voltages depending on the magnitude and direction of the calibration magnetic field and the temperature into spherical harmonics on the basis of the decomposition of the Hall output voltages.

19. The magnetic calibration device according to claim 1, further comprising a thermal insulating box housing the mount with the magnetic sensor and coil cards, wherein said thermal insulating box is connected to a control circuit for controlling the temperature within the box measured in particular by a temperature sensing element.

20. The magnetic calibration device according to claim 19, wherein the control circuit, comprised by the processing unit, comprises a Peltier element for cooling and/or heating, at least one ventilator driven by an engine outside the calibration magnetic field, and a controller.

21. The magnetic calibration device according to claim 1, wherein the current source of the Hall sensor is either a constant current source or a precise voltage source with an internal resistance substantially equal to the input resistance of the Hall sensor.

22. The magnetic calibration device according to claim 1, wherein at least two magnetic sensor cards are supported by the mount, one card carrying at least one calibrated Hall sensor and each remaining card carrying at least one Hall sensor to be calibrated by comparison with the at least one calibrated Hall sensor.

23. The magnetic calibration device according to claim 1, wherein the processing unit is comprised by a microprocessor and/or personal computer.

24. The magnetic calibration device according to claim 1, wherein the at least one processing unit is arranged outside the calibration magnetic field and stationary.

25. The magnetic calibration device according to claim 11, wherein the first electronic circuit, in particular the at least one low pass filter, is arranged in the region of the center of rotation of the cards.

* * * * *

UNITED STATES PATENT AND TRADEMARK OFFICE
CERTIFICATE OF CORRECTION

PATENT NO. : 7,259,550 B2  Page 1 of 1
APPLICATION NO. : 10/519975
DATED : August 21, 2007
INVENTOR(S) : F. Bergsma It is certified that error appears in the above-identified patent and that said Letters Patent is hereby corrected as shown below:

COLUMN  LINE

9           48          after "digital converter" insert --,--
(Claim 1,   line 7)

9           58          after "digital converters" insert --,--
(Claim 1,   line 17)

Signed and Sealed this

Third Day of June, 2008

JON W. DUDAS
*Director of the United States Patent and Trademark Office*